United States Patent [19]

Bosse et al.

[11] 4,387,151
[45] Jun. 7, 1983

[54] LIGHT-CURABLE MIXTURE AND LIGHT-SENSITIVE COPYING MATERIAL MADE THEREWITH

[75] Inventors: Dieter Bosse, Hofheim; Werner Frass, Wiesbaden, both of Fed. Rep. of Germany

[73] Assignee: Hoechst Aktiengesellschaft, Frankfurt am Main, Fed. Rep. of Germany

[21] Appl. No.: 304,686

[22] Filed: Sep. 22, 1981

[30] Foreign Application Priority Data

Sep. 25, 1980 [DE] Fed. Rep. of Germany ....... 3036077

[51] Int. Cl.³ ............................................... G03C 1/52
[52] U.S. Cl. ................................ 430/175; 430/176; 430/197; 430/300; 430/906; 430/909
[58] Field of Search ............... 430/175, 197, 284, 906, 430/909, 919, 176, 300

[56] References Cited

U.S. PATENT DOCUMENTS

| | | | |
|---|---|---|---|
| 3,660,097 | 5/1972 | Mainthia | 430/175 |
| 3,732,105 | 5/1973 | Klupfel et al. | 430/281 |
| 3,732,106 | 5/1973 | Steppan et al. | 430/283 |
| 4,186,017 | 1/1980 | Palmer | 430/175 |
| 4,289,838 | 9/1981 | Rowe et al. | 430/906 |
| 4,301,234 | 11/1981 | Uhlig | 430/175 |

*Primary Examiner*—J. Travis Brown
*Attorney, Agent, or Firm*—Schwartz, Jeffery, Schwaab, Mack, Blumenthal & Koch

[57] ABSTRACT

Disclosed is a light-curable mixture, comprising a light-sensitive compound comprising a diazonium salt polycondensation product or an organic azido compound; and a binder comprising a polymer at least swellable in an aqueous-alkaline solution and which comprises alkenylsulfonylurethane or cycloalkenylsulfonylurethane side groups. Also disclosed are light-sensitive copying materials prepared with the mixtures.

10 Claims, No Drawings

LIGHT-CURABLE MIXTURE AND LIGHT-SENSITIVE COPYING MATERIAL MADE THEREWITH

BACKGROUND OF THE INVENTION

The present invention relates to a negative-working light-curable mixture which contains, as the light-sensitive compound a diazonium salt polycondensation product or an organic azido compound and, as the binder, a high-molecular polymer which has sulfonylurethane side groups and which is soluble or swellable in an aqueous alkaline solution, and is preferably used for the preparation of printing plates.

Mixtures of the generic type indicated have been described in German Offenlegungsschrift No. 2,053,363. As the binder, they contain a reaction product of at least one alkylsulfonyl isocyanate, alkoxysulfonyl isocyanate, arylsulfonyl isocyanate or aryloxysulfonyl isocyanate and a polymer which contains hydroxyl groups. However, layers which contain diazonium salt polycondensation products and polymers of this type as binders can be developed only if organic solvents are added to the alkaline developers, having a pH range of 7.5–9.5, described in the foregoing Offenlegungsschrift. The organic solvents suitable for these purposes, in most cases low boiling solvents, can be injurious to the health of the user, in addition to causing an odor nuisance, unless there is adequate exhaustion of the vapors. Disposal of the spent developers is not possible without observing special precautions.

Polymers similar to the above-mentioned binders and having sulfonylurethane side groups have been described in German Offenlegungsschrift No. 2,053,364. These polymers contain terminal unsaturated radicals in the sulfonylurethane side groups and are used as light-crosslinkable materials, in some cases in combination with low-molecular polymerizable compounds. These polymers have not been used as polymeric binders for layers based on other light-sensitive systems, such as diazo compounds or azido compounds, evidently due to the fear that uncontrollable reactions under light and particularly reactions in the dark would result from the combination of two constituents which are light-curable by different mechanisms. Thus, it is stated, for example, in this latter German Offenlegungsschrift, page 7, lines 6–9, that the compounds described therein show substantially less tendency to undesired crosslinking than compounds having acrylic acid side groups or methacrylic acid side groups. Since, however, this tendency is always present, in contrast to saturated binders, and can be enhanced in some cases in the presence of thermally unstable compounds, such as diazo compounds or azido compounds, combinations of this type have hitherto been avoided.

SUMMARY OF THE INVENTION

It is, therefore, an object of the present invention to provide an improved light-sensitive mixture of the indicated generic type.

A further object of the invention is to provide such a light-sensitive mixture which can be developed by the use of a solvent-free, non-polluting developer and also more readily and more reliably than known mixtures, but which in other respects have the desirable properties of the known copying materials.

Still another object of the invention is to provide an improved light-sensitive copying material made from the light-sensitive mixtures according to the invention.

In accomplishing the foregoing objects, there has been provided in accordance with the present invention, a light-curable mixture, comprising a light-sensitive compound comprising a diazonium salt polycondensation product or an organic azido compound; and a binder comprising a polymer which is preferably soluble but is at least swellable in an aqueous-alkaline solution and which comprises alkenylsulfonylurethane or cycloalkenylsulfonylurethane side groups.

In accordance with another aspect of the present invention, there has been provided a light-sensitive copying material suitable for the preparation of printing plates, comprising a support and a light-curable layer comprising a light-curable mixture as defined above.

Further objects, features and advantages of the present invention will become readily apparent from the detailed description of preferred embodiments which follows.

DETAILED DESCRIPTION OF PREFERRED EMBODIMENTS

The invention relates to a light-curable mixture which contains, as the light-sensitive compound, a diazonium salt polycondensation product or an azido compound, and, as the binder, a high-molecular polymer which has sulfonylurethane side groups and which is soluble or at least swellable in an aqueous-alkaline solution, and wherein the polymer contains alkenylsulfonylurethane or cycloalkenylsulfonylurethane side groups.

According to the invention, a light-sensitive copying material for the preparation of printing plates is also provided which is composed of a support and a light-curable layer which contains, as the light-sensitive compound, a diazonium salt polycondensation product or an organic azido compound and, as the binder, a high-molecular polymer which has sulfonylurethane side groups and which is soluble or at least swellable in an aqueous-alkaline solution. The polymer contains alkenylsulfonylurethane or cycloalkenylsulfonylurethane side groups.

The unsaturated sulfonylurethanes contained in the mixture according to the invention are reaction products of polymeric substances, which contain units with free hydroxyl groups, and of sulfonyl isocyanates of the general formula

$$R-SO_2NCO$$

in which R is an aliphatic or cycloaliphatic radical having at least one double bond.

In general, the radical R contains 2 to 12 carbon atoms and one or two, preferably one, olefinic double bond. If R is an alkenyl group, the latter preferably has 2 to 4 carbon atoms. Preferred cycloalkenyl groups are those having 5 to 8 carbon atoms. Examples are vinyl, propenyl, allyl, but-4-en-1-yl, cyclohex-3-en-1-yl, cyclohex-1-enyl, methyl-cyclohex-3-en-1-yl and the like. Propenyl and cyclohexenyl radicals are particularly preferred.

In the polymers present in the mixture according to the invention, there is bonded to the key atoms which carry the hydroxyl groups in the starting polymer the grouping

$$-O-CONH-SO_2-R$$

in which the hydrogen atom bonded to the nitrogen is activated by the carbonyl group and the sulfonyl group to such an extent that it can be eliminated as a proton by means of aqueous alkali, as a result of which development with aqueous-alkaline developers becomes possible.

It has now been found, surprisingly, that the unsaturated sulfonylurethanes described above, in combination with diazonium salt polycondensation products, give layers which can be readily and cleanly developed with purely aqueous developer solutions, while corresponding layers containing saturated sulfonylurethane polymers according to Example 16 of German Offenlegungsschrift No. 2,053,363 require at least a small proportion, and preferably almost 50%, of an organic solvent in the developer. Furthermore, it has been found that, surprisingly, the storage stability of the copying materials containing unsaturated sulfonylurethanes is not noticeably poorer than that of corresponding materials containing saturated sulfonylurethanes.

The polymeric unsaturated sulfonylurethanes used in the mixture according to the invention are known per se from German Offenlegungsschrift No. 2,053,364, as already mentioned. The disclosure of this document is hereby incorporated by reference.

The following can be used as the starting polymers, containing hydroxyl groups, for the preparation of the polymeric unsaturated sulfonylurethanes: partially hydrolyzed polyvinyl esters, polyvinyl acetals with unconverted vinyl alcohol units, epoxide resins with free OH groups, partial esters and ethers of cellulose, and terpolymers of polyvinyl chloride, polyvinyl acetate and polyvinyl alcohol. Polyvinyl butyrals and polyvinyl formals, which have free OH groups and are commercially available, are particularly suitable for the preparation of binders.

The sulfonylisocyanates necessary for the preparation of the binders used according to the invention are described in German Pat. No. 1,297,601, the disclosure of which is hereby incorporated by reference.

Suitable diazonium salt polycondensation products are the condensation products of aromatic diazonium salts capable of condensation, for example, those of diphenylamine-4-diazonium salts, with aldehydes, preferably formaldehyde. With particular advantage, co-condensation products are used which, in addition to the diazonium salt units, also contain other units which are not light-sensitive and which are derived from compounds capable of condensation, in particular aromatic amines, phenols, phenol ethers, aromatic thioethers, aromatic hydrocarbons, aromatic heterocyclic compounds and organic acid amides. These condensation products are described in German Offenlegungsschrift No. 2,024,244. Generally, all those diazonium salt condensation products are suitable which are described in German Offenlegungsschrift No. 2,739,774. Both publications are hereby incorporated by reference.

The diazonium salt units are preferably derived from compounds of the formula $(R^1—R^3—)_pR^2—N_2X$ in which X is the anion of the diazonium compound, p is an integer from 1 to 3, $R^1$ is an aromatic radical having at least one position capable of condensation with an active carbonyl compound, $R^2$ is a phenylene group and $R^3$ is a single bond or one of the groups: $—(CH_2)_q—NR^4—$, $—O—(CH_2)_r—NR^4—$, $—S—(CH_2)_r—NR^4—$, $—S—CH_2CO—NR^4—$, $—O—R^5—O—$, $—O—$, $—S—$ or $—CO—NR^4—$, wherein q is a number from 0 to 5, r is a number from 2 to 5, $R^4$ is hydrogen, an alkyl group having 1 to 5 C atoms, an aralkyl group having 7 to 12 C atoms or an aryl group having 6 to 12 C atoms, and $R^5$ is an arylene group having 6 to 12 C atoms.

Further suitable light-sensitive compounds are low-molecular weight or high-molecular weight organic azides, and in particular low-molecular weight aromatic azido compounds which contain at least two azido groups. The following are examples of suitable compounds: 4,4'-diazido-stilbene, 4,4'-diazido-stilbene-2,2'-disulfonic acid, 4,4'-diazido-benzophenone, 4-4'-diazidodiphenylmethane, 4,4'-diazido-dibenzalacetone, 4,4'-diazido-dibenzalacetone-disulfonic acid, 1,3-bis-(4-azido-phenyl)-propan-2-one, 1,2-bis-(4-azidocinnamoyloxy)-ethane, 4,4'-diazido-benzalcyclohexanone, 4,4'-diazido-benzalcyclohexanone-disulfonic acid, and 2,6-bis-(4-azido-benzal)-4-methyl-cyclohexanone.

Further examples are the azidostryl compounds mentioned in British Pat. No. 790,131, the azidoimidazolyl compounds mentioned in German Pat. No. 950,618 and the diazidostilbene compounds mentioned in U.S. Pat. No. 2,848,328. These publications are also incorporated by reference.

In general, the mixtures according to the invention contain from about 5 to 90, preferably from about 10 to 70 percent by weight of diazonium compound or azido compound and from about 95 to 10, preferably from about 90 to 30 percent by weight of the binder described above, relative to the weight of all the non-volatile constituents of the mixture.

To stabilize the light-sensitive mixture, it is advantageous to add to the mixture a compound having an acid character. For this purpose, mineral acids and strong organic acids can be used, among which phosphoric acid, sulfuric acid, perchloric acid, boric acid or p-toluenesulfonic acid are preferred. Phosphoric acid is a particularly suitable acid.

Plasticizers, adhesion promoters, dyes, pigments, color-formers and other resins can also be added to the mixtures.

The nature and amount of these additives depend on the envisaged field of application of the mixture according to the invention. In principle, care must be taken here that the added materials do not absorb an excessive proportion of the acting light necessary for crosslinking and thus reduce the light-sensitivity in practice.

The light-sensitive mixtures can also contain dyes and/or pigments, which can both act as contrast agents and strengthen the layer. Possible dyes are indicated, for example, in U.S. Pat. Nos. 3,218,167 and 3,884,693, which are hereby incorporated by reference.

Particularly suitable examples are Viktoria Pure Blue FGA, Viktoria Pure Blue BO (C.I. 42595), malachite green, crystal violet, Viktoria Blue B (C.I. 44045), Rhodamine 6 GDN (C.I. 45160), Fat Red 5B (C.I. 26125), Neozapon Blue FLE (C.I. Solvent Blue 70), Brilliant Blue salt-acetate, Samaron Navy Blue, Orasol Blue GN, Renol Blue B 2 G (C.I. 74160) and Zapon Fast Fire Red B (C.I. 13900:1).

Metanil Yellow (C.I. 13065), methyl orange (C.I. 13025) or phenylazodiphenylamine can be used for increasing the image contrast after exposure.

Within the scope of the invention, the following distribution by weight of the most important additives in the light-sensitive mixture is preferred, relative to the content of non-volatile constituents, i.e., the constituents of the solid light-sensitive layer obtained after evaporation of the solvent:

Acid: about 0 to 5%
Dye or pigment: about 0 to 10%
Image contrast promoter (dye): about 0 to 10%

Commercially, the light-sensitive mixture according to the invention can be used in the form of a solution or dispersion, for example, as a so-called resist, and these are applied to an individual support, such as is customary, for example, for chemical milling, for the production of printed circuits or stencils, labeling, screen-printing forms and the like, and are exposed after drying and imagewise developed by the user. In this case, the constituents of the light-sensitive mixture are dissolved in a suitable solvent. Alcohols, ketones, esters and ethers, and the like, are suitable as solvents. Partial ethers of glycols or ketoalcohols, for example, ethylene glycolmonomethyl ether, have proved to be advantageous solvents for this purpose.

The light-sensitive mixture according to the invention can, however, also be marketed particularly in the form of a solid light-sensitive layer present on a support material, for the production of printing forms, relief images, etch resists, stencils, matrices, screenprinting forms, individual copies and the like. A particularly important application is represented by storage stable, pre-sensitized printing plates for planographic printing.

The coating of the support material is effected from appropriate organic solvents or solvent mixtures, and in particular by casting, spraying or dipping.

Examples of suitable supports are magnesium, zinc, copper, mechanically-, chemically- and electrochemically-roughened aluminum, anodized aluminum, steel and also polyester film or cellulose acetate film, nylon fix gauze and the like. It is possible for the surfaces of these materials to have been subjected to a pre-treatment, if required. The support material can here have the function of a final support or that of a temporary support material, from which the light-sensitive layer is transferred by means of lamination to the workpiece which is to be processed.

The recording material prepared with the use of the light-sensitive mixtures is used, on the one hand, for the production of images on suitable supports or receiving sheets and, on the other hand, for the production of reliefs which are used as printing forms, screens, resists and the like.

Furthermore, it is also possible to use the light-sensitive mixtures for the preparation of lacquers which can be cured by UV radiation and which can be employed as surface protection, or for the formulation of printing inks which can be cured by UV. Particularly preferably, the mixture is used for the preparation of planographic printing forms, with the preferred support material being aluminum.

Aluminum which is pretreated for this purpose in a customary manner, for example, by mechanical, chemical or electrochemical roughening and, if appropriate, subsequent anodic oxidation is particularly preferred. A further treatment of this support material, for example, with polyvinylphosphonic acid, alkali metal silicate, phosphate, hexafluorozirconate, chromate, borate, polyacrylamide and cellulose derivatives, is advantageous.

The copying materials obtained from the mixtures are processed in the known manner by imagewise exposure and washing-out of the unexposed layer areas with a suitable developer.

The copying material is exposed in the known manner under an original, using sources of copying light which emit the greatest possible spectral proportion in the near ultra-violet range. Exposure can also be effected by laser radiation. Lasers of appropriate power, which are suitable for irradiation, are relatively short-wave lasers, for example, Ar ion lasers, krypton ion lasers and helium/cadmium lasers, which emit approximately between 300 and 600 nm, and in the case of some layers, also $CO_2$ lasers which emit at 10.6 $\mu$m, or yttrium-aluminum-garnet lasers which emit at 1.06 $\mu$m.

The developer solutions used are aqueous-alkaline solutions having a pH value in the range from about 8 to 14, preferably from about 10 to 13, which contain buffer salts, for example, water-soluble alkali metal phosphates, silicates, borates, carbonates, acetates or benzoates. Further constituents used are wetting agents, preferably anionic wetting agents, and, if appropriate, water-soluble polymers. Although the copying materials according to the invention are preferably processed with purely aqueous developers, it can be advantageous in certain cases, for example, when combined with light-sensitive compounds of low solubility in water or when alkali-insoluble resins are added to the light-sensitive mixture, to add small proportions, that is to say less than about 10% by weight, preferably less than about 5% by weight, of organic solvents which are miscible with the solution. The development can be carried out in the known manner by dipping, spraying, brushing or dabbing.

The light-sensitive mixtures according to the invention have the following advantages:

They have a high light-sensitivity in practice, the capability for sharp differentiation between image areas and non-image areas, high resolving power, easy and complete development without stains, high printing runs, good compatibility of the constituents of the layer in the solvents suitable for coating, for example, ethylene glycol monomethyl ether, ethylene glycol monoethyl ether, diacetone-alcohol and mixtures of the above solvents with butyl acetate, ethylene glycol methyl ether-acetate and methyl isobutyl ketone, and the capability for ready development in solvent-free aqueous developer solutions.

The examples which follow are intended to illustrate the invention. Parts by weight and parts by volume have the same relationship as the g and $cm^3$, and percentage data and quantitative ratios are to be understood as units by weight, unless stated otherwise.

EXAMPLE 1

11.3 parts by weight of a polyvinyl butyral having a molecular weight of about 70,000–80,000 and containing 71% by weight of vinyl butyral units, 2% by weight of vinyl acetate units and 27% by weight of vinyl alcohol units, are dissolved in 170 parts by weight of anhydrous tetrahydrofuran. A mixture of 5.11 parts by weight of propenylsulfonyl isocyanate and 30 parts by weight of tetrahydrofuran is added dropwise at room temperature in the course of 15 minutes to the clear solution. In doing this, the internal temperature rises from about 25° C. to about 31° C. The solution is stirred for a further 4 hours at room temperature and then added dropwise to 5,000 parts by volume of water. The white, fibrous product obtained is filtered off with suction and dried.

The yield amounts to 16.4 parts by weight of a polymer which has a softening point of about 161° C. and an acid number of 81.0.

A coating solution is prepared from:
- 97.0 parts by weight of the binder described above,
- 48.3 parts by weight of a diazonium salt polycondensation product prepared from 1 mole of 3-methoxydiphenylamine-4-diazonium sulfate and 1 mole of 4,4'-bis-methoxymethyl-diphenyl ether in 85% strength phosphoric acid and isolated as the mesitylenesulfonate,
- 4.8 parts by weight of phosphoric acid (85%),
- 3.5 parts by weight of Viktoria Pure Blue FGA (C.I. Basic Blue 81) and
- 1.6 parts by weight of phenylazodiphenylamine in
- 3,500 parts by weight of ethylene glycol monomethyl ether and
- 1,036 parts by weight of tetrahydrofuran.

The solution is applied to an aluminum foil which has been roughened by brushing with an aqueous suspension of an abrasive and then pretreated with a 0.1% strength aqueous solution of polyvinylphosphonic acid, and dried.

The copying layer is exposed under a negative original for 35 seconds with a metal halide lamp of 5 kW power.

The exposed layer is treated with a developer solution of the following composition:
- 5 parts by weight of sodium lauryl-sulfate,
- 1.5 parts by weight of sodium metasilicate $\times$ 5 $H_2O$,
- 1 part by weight of trisodium phosphate $\times$ 12 $H_2O$ and
- 92.5 parts by weight of water by means of a cottonwood pad, the unexposed layer areas being removed, and then rinsed with water and dried. On the copy, step 5 of a silver film continuous tone step wedge having a density range from 0.05 to 3.05, the density increment being 0.15, is still solid.

On a sheet-fed offset machine, the printing plate obtained gives a run of 30,000 sheets.

EXAMPLE 2

22.6 Parts by weight of the polyvinyl butyral described in Example 1 and 20.45 parts by weight of propenylsulfonyl isocyanate are reacted as described in Example 1. After precipitation in water, a white, fibrous material having an acid number of 144.1 is obtained.

A coating solution is prepared from:
- 30.3 parts by weight of the reaction product described above,
- 15.1 parts by weight of the diazonium salt polycondensation product described in Example 1,
- 1.0 part by weight of phosphoric acid (85%),
- 1.1 parts by weight of Viktoria Pure Blue FGA (C.I. Basic Blue 81) and
- 1.1 parts by weight of phenylazodiphenylamine in
- 1,600 parts by weight of ethylene glycol monomethyl ether.

The solution is applied to an electrochemically roughened and anodized aluminum foil which has been post-treated with polyvinylphosphonic acid. The layer weight after drying is 0.8 $g/m^2$.

Processing is carried out as described in Example 1. After imagewise exposure, the offset plate is in this case dipped for one minute into the developer and then sprayed with water from a nozzle. The layer is developed perfectly, that is to say that sharply differentiated images of even very small dot and line elements are obtained, there are no stains or layer residues on non-image areas and high resolution is achieved.

EXAMPLE 3

A coating solution is prepared from:
- 34.1 parts by weight of the polymeric reaction product described in Example 2,
- 11.4 parts by weight of the diazonium salt polycondensation product described in Example 1,
- 0.5 part by weight of phosphoric acid (85%),
- 1.1 parts by weight of Metanil Yellow (C.I. 13065), and
- 1.5 parts by weight of Viktoria Blue B (C.I. 44045) in
- 1,600 parts by weight of ethylene glycol monomethyl ether.

The solution is applied to the support indicated in Example 2.

The dry layer weight is 0.8 $g/m^2$. Processing is carried out as described in Example 1. The printing form thus obtained gives long runs on a sheet-fed offset machine.

EXAMPLE 4

22.6 parts by weight of the polyvinyl butyral indicated in Example 1 and 4.09 parts by weight of propenylsulfonyl isocyanate are reacted as described in Example 1.

A coating solution is prepared from:
- 48.4 parts by weight of a 6.26% strength solution of the above-described polymer in tetrahydrofuran,
- 1.51 parts by weight of the diazo polycondensation product described in Example 1,
- 0.15 part by weight of phosphoric acid (85%) and
- 0.11 part by weight of Viktoria Pure Blue FGA (C.I. Basic Blue 81) in
- 140 parts by weight of ethylene glycol monomethyl ether.

The solution is applied to the support described in Example 2 in such a way that, after drying, a layer weight of 0.85 $g/m^2$ is obtained.

The exposed layer is treated, in a manner similar to that described in Example 1, with a developer solution of the following composition:
- 5 parts by weight of sodium lauryl-sulfate,
- 3 parts by weight of sodium metasilicate $\times$ 5 $H_2O$ and
- 92 parts by weight of water.

The printing form obtained gives more than 70,000 prints on sheet-fed offset machines.

EXAMPLE 5

22.6 parts by weight of the polyvinyl butyral indicated in Example 1 and 26.02 parts by weight of cyclohex-3-en-1-yl-sulfonyl isocyanate are reacted as described in Example 1.

A coating solution is prepared from
- 30.3 parts by weight of the above reaction product having an acid number of 142.6,
- 15.1 parts by weight of the diazonium salt polycondensation product described in Example 1,
- 1.2 parts by weight of phosphoric acid (85%),
- 1.1 parts by weight of phenylazodiphenylamine and
- 1.5 parts by weight of Viktoria Pure Blue FGA (C.I. Basic Blue 81) in
- 1,600 parts by weight of ethylene glycol monomethyl ether.

The solution is applied to the support described in Example 2, to give a dry layer weight of 0.8 $g/m^2$. After imagewise exposure under a source of UV light, a treatment with the developer mentioned in Example 4 is carried out.

The printing form obtained gives more than 80,000 good prints on a Heidelberg-GTO sheet-fed offset printing press.

EXAMPLE 6

22.6 parts by weight of the polyvinyl butyral described in Example 1 and 27.97 parts by weight of methylcyclohex-3-en-1-yl-sulfonyl isocyanate (mixture of the isomeric 3- and 4-methyl compounds) are reacted as indicated in Example 1. After precipitation in water, a white flocky material is obtained which has an acid number of 131.6 and is readily soluble in 3% strength aqueous ammonia solution.

A coating solution is prepared from:
- 30.3 parts by weight of the polymer described above,
- 15.1 parts by weight of the diazo polycondensation product described in Example 1,
- 1.2 parts by weight of phosphoric acid (85%),
- 1.1 parts by weight of phenylazodiphenylamine and
- 1.5 parts by weight of Viktoria Pure Blue FGA (C.I. Basic Blue 81) in
- 1,600 parts by weight of ethylene glycol monomethyl ether and whirler-coated onto the support described in Example 2 in such a way that the layer weight is 0.8 g/m$^2$. Processing is carried out as indicated in Example 1, but using the developer from Example 4. The printing form thus obtained gives more than 60,000 good prints on a sheet-fed offset machine.

EXAMPLE 7

11.3 parts by weight of the polyvinyl butyral indicated in Example 1 and 13.88 parts by weight of vinylsulfonyl isocyanate are reacted as described in Example 1. After precipitation in water, 19.3 g (77% of theoretical) of a white, fibrous material having an acid number of 183.9 are obtained.

A coating solution is prepared from:
- 30.3 parts by weight of the reaction product described above,
- 15.1 parts by weight of the diazo polycondensation product indicated in Example 1,
- 1.0 part by weight of phosphoric acid (85%)
- 1.1 parts by weight of a phenylazodiphenylamine and
- 1.5 parts by weight of Viktoria Pure Blue FGA (C.I. Basic Blue 81) in
- 1,650 parts by weight of ethylene glycol monomethyl ether.

The solution is applied to the aluminum foil described in Example 2, to give a dry layer weight of 0.7 g/m$^2$.

The copying layer is exposed under a negative original for 70 seconds with a metal halide lamp and treated, as described in Example 1, with the developer from Example 4.

The printing form thus obtained gives more than 40,000 good prints on a sheet-fed offset machine.

EXAMPLE 8

A coating solution is prepared from:
- 26.75 parts by weight of an 8% strength solution of the reaction product described in Example 1, in tetrahydrofuran,
- 2.14 parts by weight of 2,6-bis-(4-azido-benzal)-4-methyl-cyclohexanone and
- 0.23 part by weight of Rhodamine 6 GDN extra (C.I. 45160) in
- 100 parts by weight of ethylene glycol monomethyl ether and
- 50 parts by weight of tetrahydrofuran.

The solution is applied to the support indicated in Example 2. The dry layer weight is 0.73 g/m$^2$. Processing is carried out as described in Example 1. With the printing form thus obtained, long runs are achieved on a sheet-fed offset machine.

EXAMPLE 9

A coating solution is prepared from:
- 26.75 parts by weight of an 8.0% strength solution of the reaction product described in Example 1, in tetrahydrofuran,
- 2.14 parts by weight of 2,6-bis-(4-azido-benzal)-4-methyl-cyclohexanone and
- 0.23 part by weight of Viktoria Pure Blue FGA (C.I. Basic Blue 81) in
- 100 parts by weight of ethylene glycol monomethyl ether and
- 50 parts by weight of tetrahydrofuran.

The solution is applied to the support indicated in Example 2 in such a way that, after drying, a layer weight of 0.7 g/m$^2$ is obtained.

After exposure under a negative original, the plate is developed with a developer solution of the following composition:
- 5 parts by weight of the triethanolammonium salt of lauryl-sulfate,
- 1 part by weight of sodium metasilicate$\times$5 H$_2$O,
- 1.5 parts by weight of trisodium phosphate$\times$12 H$_2$O and
- 92.5 parts by weight of water and is made ready for printing by inking with greasy ink.

Many thousands of good prints are obtained with the plate thus obtained on a Heidelberg-GTO sheet-fed offset machine.

EXAMPLE 10

A coating solution is prepared from:
- 26.75 parts by weight of an 8.0% strength solution of the reaction product described in Example 1, in tetrahydrofuran,
- 2.14 parts by weight of 2,6-bis-(4-azido-benzal)-4-methyl-cyclohexanone,
- 0.23 part by weight of Rhodamine 6 GDN extra and
- 0.21 part by weight of 2-benzoylmethylene-1-methyl-$\beta$-naphthothiazine in
- 100 parts by weight of ethylene glycol monomethyl ether and
- 50 parts by weight of tetrahydrofuran.

The solution is whirler-coated onto the support described in Example 2. The dry layer weight is 0.75 g/m$^2$.

The copying layer is exposed under a negative original for 35 seconds with a metal halide lamp of 5 kW power. This gives a clearly visible dark red, positive image.

The exposed layer is treated, with the aid of a cottonwood pad, with a developer solution of the following composition:
- 5 parts by weight of sodium lauryl-sulfate,
- 1 part by weight of sodium metasilicate$\times$5 H$_2$O and
- 94 parts by weight of water, the non-image areas being removed, and is then rinsed with water and squeegeed. On the copy, step 5 of the silver film continuous tone step wedge described in Example 1 is still solid.

The resulting printing plate gives a run of 170,000 sheets on a sheet-fed offset machine.

EXAMPLE 11

A coating solution is prepared from:
- 26.75 parts by weight of an 8% strength solution of the reaction product described in Example 1, in tetrahydrofuran,
- 2.1 parts by weight of 4,4'-diazido-stilbene-3,3'-disulfonic acid,
- 0.23 parts by weight of Rhodamine 6 GDN extra and
- 50 parts by weight of ethylene glycol monomethyl ether.

The solution is applied to the support indicated in Example 2. The dry layer weight is 0.75 g/m$^2$. Processing is carried out as described in Example 1. The developer used has the following composition:
- 5 parts by weight of sodium lauryl-sulfate,
- 0.5 part by weight of sodium metasilicate×5 H$_2$O and
- 94.5 parts by weight of water.

This printing form gives long runs on sheet-fed offset machines.

EXAMPLE 12

A coating solution is prepared from:
- 54.35 parts by weight of an 8.34% strength solution of the reaction product described in Example 1, in tetrahydrofuran,
- 0.91 part by weight of the diazonium salt polycondensation product described in Example 1,
- 0.18 part by weight of phosphoric acid (85%),
- 0.06 part by weight of phenylazodiphenylamine and
- 0.13 part by weight of Viktoria Pure Blue FGA in
- 150 parts by weight of ethylene glycol monomethyl ether.

The solution is applied to electrochemically roughened and anodized aluminum in such a way that, after drying, a layer weight of 1.1 g/m$^2$ is obtained.

Processing is carried out in a manner similar to that described in Example 1. The printing form obtained gives runs of more than 150,000 prints on sheet-fed offset machines.

EXAMPLE 13

22.6 parts by weight of a terpolymer composed of 91% of vinyl chloride, 3% of vinyl acetate, 6% of vinyl alcohol and having a mean molecular weight of 15,500 and a softening point of 77° C., are reacted, as described in Example 1, with 4.52 parts by weight of propenylsulfonyl isocyanate. The product obtained has an acid number of 42.3.

A coating solution is prepared from:
- 56.55 parts by weight of a 6.35% strength solution of the above-described reaction product in tetrahydrofuran,
- 1.79 parts by weight of the diazonium salt polycondensation product described in Example 1,
- 0.18 part by weight of phosphoric acid (85%),
- 0.06 part by weight of phenylazodiphenylamine and
- 0.13 part by weight of Viktoria Pure Blue FGA in
- 140 parts by weight of ethylene glycol monomethyl ether.

The solution is applied to an electrochemically roughened and anodized aluminum foil which has been post-treated with polyvinylphosphonic acid. After drying, the layer weight of the light-sensitive layer is 1.0 g/m$^2$.

Processing was carried out in a manner similar to that described in Example 1.

This printing form gives good runs on sheet-fed offset machines.

EXAMPLE 14

A coating solution is prepared from:
- 3.03 parts by weight of the reaction product described in Example 1,
- 1.51 parts by weight of a diazonium salt polycondensation product prepared from paraformaldehyde and diphenylamine-4-diazonium chloride in 85% strength phosphoric acid,
- 0.05 part by weight of phosphoric acid (85%),
- 0.15 part by weight of crystal violet and
- 0.11 part by weight of phenylazodiphenylamine in
- 170 parts by weight of ethylene glycol monomethyl ether.

The solution is applied to an electrochemically roughened and anodized aluminum foil in such a way that, after drying, a layer weight of 0.3 g/m$^2$ is obtained.

Processing is carried out in a manner similar to that described in Example 1.

The printing form obtained gives many thousands of good prints in sheet-fed offset machines.

EXAMPLE 15

A coating solution is prepared from:
- 16.0 parts by weight of an 8.0% strength solution of the reaction product described in Example 1, in tetrahydrofuran,
- 0.725 part by weight of the diazonium salt polycondensation product described in Example 1,
- 0.072 part by weight of phosphoric acid (85%),
- 0.01 part by weight of phenylazodiphenylamine,
- 0.5 part by weight of Renol Blue B2G-H (Pigment Blue 15:3, C.I. 74160), and
- 86.6 parts by weight of ethylene glycol monomethyl ether.

The solution is applied to an electrochemically roughened and anodized aluminum foil which has been post-treated with polyvinylphosphonic acid. After drying, the layer weight of the light-sensitive layer is 1.0 g/m$^2$.

Processing is carried out in a manner similar to that described in Example 1.

This printing form gives good runs on sheet-fed offset machines.

EXAMPLE 16

Analogously to the reaction described in Example 1,
- 45.2 parts by weight of a polyvinyl butyral having a molecular weight of more than 80,000 and containing 77–80% by weight of vinyl butyral units, 2% by weight of vinyl acetate units and 18–21% by weight of vinyl alcohol units, are dissolved in
- 580 parts by weight of anhydrous tetrahydrofuran, and a solution of
- 31.7 parts by weight of propenylsulfonyl isocyanate in
- 60 parts by weight of tetrahydrofuran is added thereto at room temperature and the mixture is allowed to react for a further 4 hours at room temperature.

A coating solution is prepared from:

906.7 parts by weight of a 12% strength solution of the above-described binder in tetrahydrofuran,
10.88 parts by weight of the diazonium salt polycondensation product described in Example 1,
1.08 parts by weight of phosphoric acid (85%),
0.8 part by weight of Viktoria Pure Blue FGA and
0.36 part by weight of phenylazodiphenylamine in
5,800 parts by weight of ethylene glycol monomethyl ether,
2,500 parts by weight of tetrahydrofuran and
770 parts by weight of butyl acetate.

The solution is applied to an electrochemically roughened and anodized aluminum foil which has been post-treated with polyvinylphosphonic acid. After drying, the layer weight is 0.5 g/m².

The plate is exposed to the laser light of an argon ion laser in such a way that the layer is subjected to an energy of 5 mJ/cm².

The exposed layer is developed with an emulsion lacquer which is marketed by Western Litho Co. under the name "Jet Black Medium".

On a sheet-fed offset machine, the printing plate obtained gives a run of more than 40,000 sheets.

What is claimed is:

1. A light-curable mixture, comprising:
   a light-sensitive compound comprising a diazonium salt polycondensation product or an organic azido compound; and
   a binder comprising a polymer at least swellable in an aqueous-alkaline solution and which comprises alkenylsulfonylurethane or cycloalkenylsulfonylurethane side groups.

2. A light-curable mixture as claimed in claim 1, wherein said polymer comprises a reaction product of a polymer containing free hydroxyl groups with an alkenylsulfonyl isocyanate or cycloalkenylsulfonyl isocyanate.

3. A light-curable mixture as claimed in claim 2, wherein said polymer containing free hydroxyl groups comprises a partially hydrolyzed polyvinyl ester, a polyvinyl acetal having unconverted vinyl alcohol units, an epoxide resin, a partial ester or ether of cellulose, or a terpolymer comprising units of vinyl chloride, vinyl acetate and vinyl alcohol.

4. A light-curable mixture as claimed in claim 3, wherein said polymer containing free hydroxyl groups comprises a polyvinyl butyral or polyvinyl formal, having unconverted vinyl alcohol units.

5. A light-curable mixture as claimed in claim 1, wherein said diazonium salt polycondensation product comprises recurring $A-N_2X$ and B units which are linked by intermediate members which are derived from carbonyl compounds capable of condensation, wherein A comprises the radical of an aromatic diazonium compound which is capable of condensation with formaldehyde, and B comprises the radical of a compound which is free from diazonium groups and capable of condensation with formaldehyde.

6. A light-curable mixture as claimed in claim 5, wherein B comprises the radical of an aromatic amine, a phenol, phenol ether, aromatic thioether, aromatic hydrocarbon, aromatic heterocyclic compound or an organic acid amide.

7. A light-curable mixture as claimed in claim 5, wherein said intermediate members comprise methylene groups.

8. A light-curable mixture as claimed in claim 1, wherein said alkenyl or cycloalkenyl group contains between 2 and 12 carbon atoms.

9. A light-curable mixture as claimed in claim 8, wherein said alkenyl group contains between 2 and 4 carbon atoms and said cycloalkenyl group contains between 5 and 8 carbon atoms.

10. A light-sensitive copying material suitable for the preparation of printing plates, comprising:
    a support; and
    a light-curable layer comprising a light-curable mixture as defined by claim 1.

* * * * *